United States Patent
Rana et al.

(10) Patent No.: US 7,981,778 B2
(45) Date of Patent: Jul. 19, 2011

(54) DIRECTIONAL SOLID PHASE CRYSTALLIZATION OF THIN AMORPHOUS SILICON FOR SOLAR CELL APPLICATIONS

(75) Inventors: Virendra V. Rana, Los Gatos, CA (US); Robert Z. Bachrach, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/507,761

(22) Filed: Jul. 22, 2009

(65) Prior Publication Data
US 2011/0021008 A1   Jan. 27, 2011

(51) Int. Cl.
*H01L 21/20* (2006.01)
*H01L 21/36* (2006.01)

(52) U.S. Cl. ............ 438/486; 438/487; 257/E21.133

(58) Field of Classification Search ............ 438/486, 438/487; 257/E21.133
See application file for complete search history.

(56) References Cited

U.S. PATENT DOCUMENTS

| | | | |
|---|---|---|---|
| 4,144,493 A | 3/1979 | Lee et al. | |
| 4,773,944 A | 9/1988 | Nath et al. | |
| 4,892,592 A | 1/1990 | Dickson et al. | |
| 5,248,349 A | 9/1993 | Foote et al. | |
| 5,258,077 A | 11/1993 | Shahryar | |
| 5,910,854 A | 6/1999 | Varaprasad et al. | |
| 5,942,050 A | 8/1999 | Green et al. | |
| 5,956,572 A | 9/1999 | Kidoguchi et al. | |
| 6,077,722 A | 6/2000 | Jansen et al. | |
| 6,265,242 B1 | 7/2001 | Komori et al. | |
| 6,281,696 B1 | 8/2001 | Voogel | |
| 6,300,593 B1 | 10/2001 | Powell | |
| 6,423,565 B1 | 7/2002 | Barth et al. | |
| 6,429,037 B1 | 8/2002 | Wenham et al. | |
| 6,455,347 B1 | 9/2002 | Hiraishi et al. | |
| 6,559,411 B2 | 5/2003 | Borgeson et al. | |
| 6,578,764 B1 | 6/2003 | Hiraishi et al. | |
| 6,762,081 B2 * | 7/2004 | Yamazaki et al. | 438/150 |
| 6,784,361 B2 | 8/2004 | Carlson et al. | |
| 6,794,275 B2 | 9/2004 | Kondo et al. | |
| 6,841,728 B2 | 1/2005 | Jones et al. | |
| 6,919,530 B2 | 7/2005 | Borgeson et al. | |
| 7,569,462 B2 | 8/2009 | Rana et al. | |
| 2001/0037823 A1 | 11/2001 | Middelman et al. | |

(Continued)

FOREIGN PATENT DOCUMENTS
EP   0 795 202   5/2003

(Continued)

OTHER PUBLICATIONS

PCT Search Report. PCT/US2009/054677 dtd. Mar. 18, 2010.

(Continued)

*Primary Examiner* — Alexander G Ghyka
*Assistant Examiner* — Seahvosh J Nikmanesh
(74) *Attorney, Agent, or Firm* — Patterson & Sheridan, L.L.P.

(57) ABSTRACT

Embodiments of the present invention provide a method for converting a doped amorphous silicon layer deposited onto a crystalline silicon substrate into crystalline silicon having the same grain structure and crystal orientation as the underlying crystalline silicon substrate upon which the amorphous silicon was initially deposited. Additional embodiments of the present invention provide depositing a dielectric passivation layer onto the amorphous silicon layer prior to the conversion. A temperature gradient is provided at a temperature and for a time period sufficient to provide a desired p-n junction depth and dopant profile.

20 Claims, 3 Drawing Sheets

U.S. PATENT DOCUMENTS

| | | |
|---|---|---|
| 2002/0117199 A1 | 8/2002 | Oswald |
| 2003/0013280 A1* | 1/2003 | Yamanaka .................... 438/487 |
| 2003/0044539 A1 | 3/2003 | Oswald |
| 2003/0104664 A1 | 6/2003 | Kondo et al. |
| 2003/0129810 A1 | 7/2003 | Barth et al. |
| 2003/0132435 A1* | 7/2003 | Nakazawa et al. ............... 257/49 |
| 2005/0271097 A1* | 12/2005 | Yamazaki et al. ....... 372/29.014 |
| 2006/0103371 A1 | 5/2006 | Manz |
| 2006/0196536 A1 | 9/2006 | Fujioka et al. |
| 2007/0235074 A1 | 10/2007 | Henley et al. |
| 2008/0012189 A1 | 1/2008 | Manz |
| 2008/0105295 A1 | 5/2008 | Manz |
| 2008/0115827 A1 | 5/2008 | Woods et al. |
| 2008/0142763 A1 | 6/2008 | Rana et al. |
| 2008/0160726 A1* | 7/2008 | Lim et al. ...................... 438/479 |
| 2008/0179547 A1 | 7/2008 | Henley |
| 2008/0295885 A1 | 12/2008 | Lee |
| 2009/0000108 A1 | 1/2009 | Manz |
| 2009/0077805 A1 | 3/2009 | Bachrach et al. |

FOREIGN PATENT DOCUMENTS

| | | |
|---|---|---|
| JP | 2004-342455 | 12/2004 |
| WO | WO 96/17388 | 6/1996 |
| WO | WO2008076730 A1 | 6/2008 |
| WO | WO-2008/092186 | 8/2008 |

OTHER PUBLICATIONS

Javier Alda, "Laser and Gaussian Beam Propagation and Transformation." Encyclopedia of Optical Engineering, pp. 999-1013, 2003.

* cited by examiner

DIRECTIONAL SOLID PHASE CRYSTALLIZATION OF THIN AMORPHOUS SILICON FOR SOLAR CELL APPLICATIONS

CROSS-REFERENCE TO RELATED APPLICATIONS

This application claims benefit of U.S. Provisional Patent Application Ser. No. 61/082,812, filed Jul. 22, 2008, and Provisional Patent Application Ser. No. 61/097,793, filed Sep. 19, 2008, which are both herein incorporated by reference in their entirety.

BACKGROUND OF THE INVENTION

1. Field of the Invention

Embodiments of the present invention generally relate to the fabrication of silicon solar cells and, more particularly, to a method of converting a layer of amorphous silicon deposited on a sheet of crystalline silicon to crystalline silicon by solid phase epitaxy.

2. Description of the Related Art

Solar cells are photovoltaic (PV) devices that convert sunlight directly into electrical power. Solar cells typically have one or more p-n junctions. Each junction comprises two different regions within a semiconductor material where one side is denoted as the p-type region and the other as the n-type region. When the p-n junction of a solar cell is exposed to sunlight (consisting of energy from photons), the sunlight is directly converted to electricity through the PV effect. Solar cells generate a specific amount of electric power and are tiled into modules sized to deliver the desired amount of system power. Solar modules are joined into panels with specific frames and connectors.

Typically, the p-n junction of a solar cell is formed by diffusing an n-type dopant, such as phosphorous, into the surface of a p-type silicon sheet, wafer, or substrate. One example of performing phosphorous diffusion includes coating phosphosilicate glass (PSG) compounds onto the surface of a silicon substrate and carrying out diffusion/annealing inside a furnace. Another example of diffusing a phosphorous dopant into a silicon substrate includes bubbling nitrogen gas through liquid phosphorous oxychloride ($POCl_3$) sources, which are injected into an enclosed quartz tube in a furnace loaded with batch-type quartz boats containing silicon substrates.

When the aforementioned processes are used to form the p-n junction of solar cells in silicon substrates, additional processing steps including etching of PSG is required. In addition, the silicon substrates, on which the diffusion occurs, are usually stacked vertically in the quartz boats for insertion into the furnace. Such handling of the substrates inevitably results in breakage of some of the silicon substrates because the substrates are relatively thin, such as 0.3 mm thick or less.

Although phosphorous diffusion of the phosphorous-doped, n-type silicon material for solar junction formation may be created by the furnace type diffusion/annealing processes discussed above, these processes require performing complex gaseous diffusion processes that require many additional pre-cleaning, post-cleaning, etching, and stripping steps. For example, a layer of PSG may remain on the surface of the substrate after formation of the n-type material. This PSG layer must be removed by wet chemical etching in diluted hydrofluoric acid solutions.

Additionally, prior art techniques use separate equipment for the phosphorous diffusion and the deposition of dielectric layers for passivation of the surface of the substrate. The use of such prior art p-n junction formation and surface passivation techniques for solar cell fabrication is expensive and can result in a defective interface between the dielectric passivation layer and the doped substrate, leading to a high surface recombination velocity for the minority charge carriers.

Moreover, using gaseous diffusion/annealing processes in a furnace, as previously described, typically results in the doping of both sides of the silicon substrate. This requires removing or otherwise isolating the doped front side of the substrate from the doped back side of the substrate in order to make the solar cell functional.

Therefore a need exists for a method for forming a p-n junction at a desired depth in a crystalline silicon substrate to provide a structure for the formation of a solar cell which eliminates many of the pre-cleaning, post-cleaning, etching, and stripping steps present in the prior art, thereby providing a more economical, efficient solar cell fabrication.

SUMMARY OF THE INVENTION

Embodiments of the invention may provide a method of heat treating a crystalline silicon substrate, comprising depositing an amorphous silicon film on a first surface of the crystalline silicon substrate, wherein the first surface of the crystalline silicon substrate is generally opposite to a second surface, and heating the crystalline silicon substrate and the amorphous silicon film to a temperature that is sufficient to crystallize the amorphous silicon film, wherein the heating creates a temperature gradient between the second surface and the first surface.

Embodiments of the invention may further provide a method of heat treating a crystalline silicon substrate to form a p-n junction, comprising depositing an amorphous silicon film on a first surface of the crystalline silicon substrate, wherein the first surface of the crystalline silicon substrate is generally opposite to second surface, depositing a dielectric layer over the amorphous silicon film, and heating the crystalline silicon substrate and the amorphous silicon film to a temperature that is sufficient to crystallize the amorphous silicon film, wherein the heating creates a temperature gradient between the second surface and the first surface so that a temperature of the first surface is higher than a temperature of a point within the amorphous silicon film that is a distance from the first surface.

Embodiments of the invention may further provide a system for heat treating a substrate, comprising a first processing chamber having a first processing region and precursor source assembly, wherein the precursor source assembly is configured to deliver a silicon containing gas to a first surface of a substrate disposed in the first processing region to form an amorphous silicon film on the first surface, and a substrate support having a substrate supporting surface and a heating element that is positioned adjacent to the substrate supporting surface, wherein the substrate supporting surface is adapted to support the second surface of a substrate, and the heating element is configured to heat the substrate to a temperature that is sufficient to crystallize an amorphous silicon film disposed on the first surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
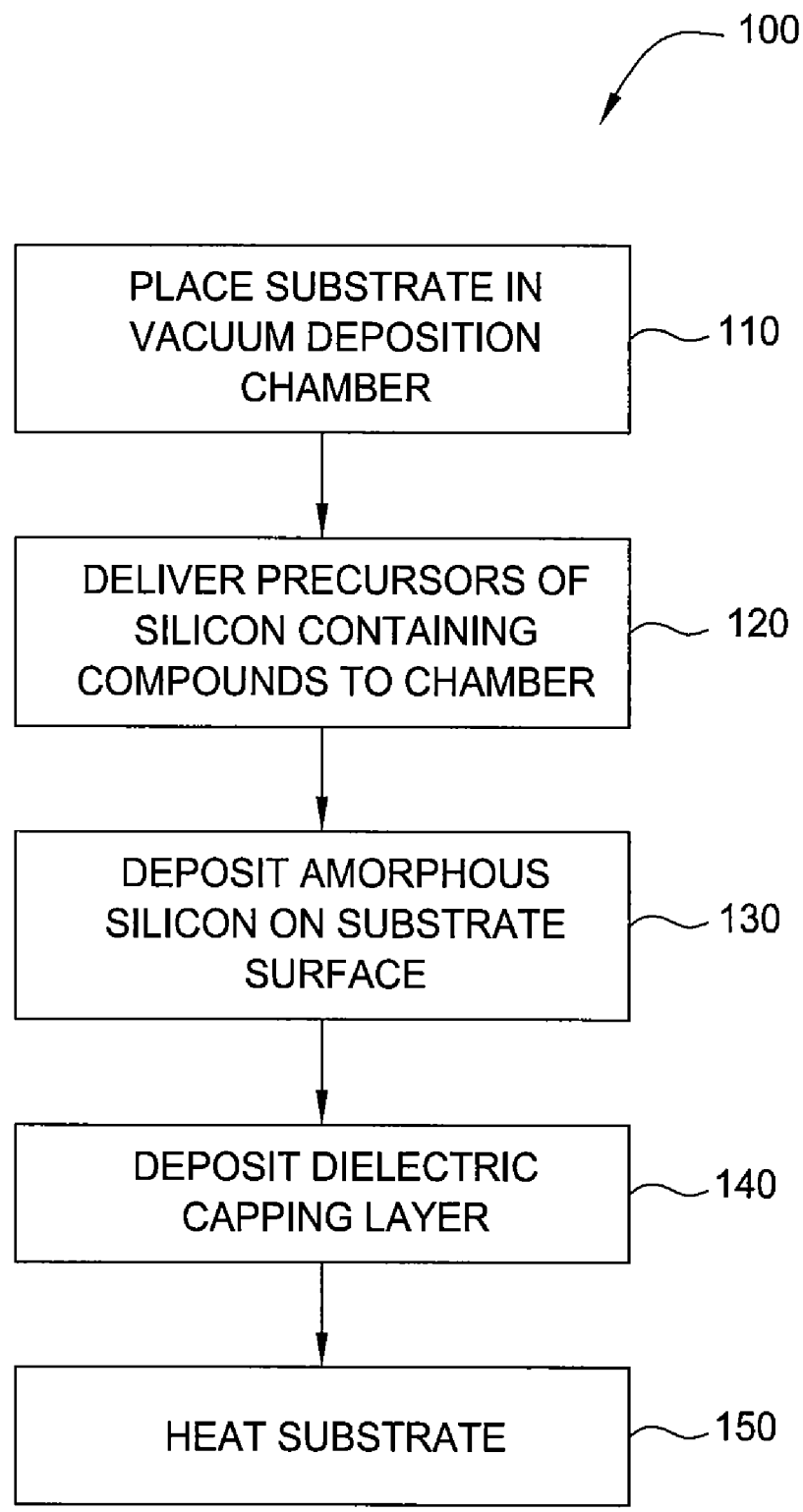
FIG. 1 depicts a process flow diagram illustrating one embodiment of a method of the present invention.

Embodiments of the present invention provide a method for converting an amorphous silicon layer deposited onto a crystalline silicon substrate into crystalline silicon having the same grain structure and crystal orientation as the underlying crystalline silicon substrate upon which the amorphous silicon was initially deposited. In one embodiment, since the crystallization process is generally performed at a temperature below the melting point of the amorphous silicon layer, the process of causing the amorphous silicon layer to crystallize to match the crystalline silicon substrate's crystal structure is sometimes referred to herein as solid phase epitaxy. Additional embodiments of the present invention provide depositing a dielectric passivation layer onto the amorphous silicon layer prior to the conversion. In one embodiment, the amorphous silicon layer is doped with doping material of the opposite conductivity type from the underlying crystalline silicon substrate to provide a p-n junction when the amorphous silicon layer has been converted to crystalline silicon. For example, if the crystalline silicon substrate is p-type silicon material, the deposited amorphous silicon layer is doped with an n-type dopant, such as phosphorous, to provide an n-type emitter layer on the surface of the crystalline silicon substrate. Similarly, if the crystalline silicon substrate is n-type silicon material, the amorphous silicon layer is doped with a p-type dopant, such as boron, so that after solid phase epitaxy and boron diffusion into the substrate, an n-p junction is created in the resulting structure.

In one embodiment, the conversion of the deposited amorphous silicon layer is accomplished by generating a temperature gradient across the silicon substrate having the amorphous silicon layer deposited thereon, as will be discussed below. In one embodiment, a temperature gradient is formed so that the temperature of the deposited amorphous silicon layer at the substrate surface is higher than the temperature of the amorphous silicon layer a distance in a direction substantially normal, or perpendicular, to the substrate surface. The temperature gradient is provided at a temperature and for a time period that is sufficient to crystallize the amorphous material such that, as it crystallizes, it assumes the same grain structure and crystal orientation as that of the underlying crystalline silicon substrate. Moreover the temperature gradient is provided at a temperature and for a time period sufficient to provide the desired p-n junction depth and dopant profile.

It is believed that the processes described herein are superior to convention thermal processing schemes, such as uniform heating of substrate (e.g., heating from all sides) or heating from the top (e.g., amorphous silicon) side, in which case the crystal structure of the crystalline silicon substrate will not be replicated due to the crystallization and growth of multi-grained silicon starting from the top surface and/or regions within the deposited film. It has been found that when heat is delivered to the amorphous silicon side of a crystalline silicon substrate, the amorphous silicon layer crystallizes into a polysilicon layer (e.g., silicon with multiple grains) starts from the top surface. The polysilicon structure then propagates into the thickness of the film, which interferes with any crystallization that is emanating from the amorphous-silicon/single-crystal-substrate interface.

FIG. 1 depicts a process flow diagram illustrating one embodiment of a method 100 of the present invention. At step 110, a crystalline silicon substrate is placed into a vacuum deposition chamber. The substrate may be formed of single crystalline silicon or multi-crystalline silicon depending on the particular application of the product to be produced. In one embodiment, the substrate is a monocrystalline substrate (e.g., Si<100> or Si<111>). The vacuum deposition chamber may be a stand-alone chamber or part of a multi-chamber processing system.

At step 120, a mixture of precursors is delivered into the vacuum deposition chamber. In one embodiment, the mixture of precursors includes silicon-containing compounds. The silicon-containing compounds may include silane ($SiH_4$), disilane ($Si_2H_6$), tetrafluorosilane ($SiF_4$), or other silicon-containing compounds useful for depositing a layer of amorphous silicon directly onto a surface of the crystalline silicon substrate. In one embodiment, the silicon-containing compound is delivered at a flow rate of about 10 sccm or higher depending on the size of the crystalline silicon substrate and vapor deposition chamber. In one embodiment, the silicon-containing compound is delivered at a flow rate between about 50 sccm and about 500 sccm.

In one embodiment of the present invention, the crystalline silicon substrate is p-type, and an n-type precursor is delivered to the vapor deposition chamber along with the silicon-containing compounds. In one embodiment, the n-type precursor is a phosphorous-containing compound such as phosphine ($PH_3$). In one embodiment, the phosphorous-containing compound is delivered at a concentration of 0.5% in hydrogen at a flow rate of about 30 sccm or higher. In one embodiment, the phosphorous-containing compound is delivered at a flow rate between about 150 sccm and about 1500 sccm.

In an alternate embodiment, the crystalline silicon substrate is n-type, and a p-type precursor is delivered to the vapor deposition chamber along with the silicon-containing compounds. In one embodiment, the p-type precursor is a boron containing compound.

In one embodiment, the mixture of precursors delivered to the deposition chamber includes a hydrogen-containing compound such as hydrogen gas ($H_2$). In one embodiment, the hydrogen-containing compound is delivered at a flow rate of about 100 sccm or higher. In one embodiment, the hydrogen-containing compound is delivered at a flow rate of about 1000 sccm or higher. In one embodiment, the mixture of precursors delivered to the deposition chamber includes silane, hydrogen gas, and phosphine.

At step 130, a doped amorphous silicon film is deposited on a first surface of the crystalline silicon substrate from the gas mixture in step 120. In one embodiment, the doped amorphous silicon film is deposited at a film thickness from about 100 Å to about 1000 Å. In one embodiment, the crystalline silicon substrate is p-type, and the amorphous silicon film is n-doped. In one embodiment, a phosphorous-doped amorphous silicon film is deposited on the first surface of the crystalline silicon substrate from the gas mixture in step 120. In an alternate embodiment, the crystalline silicon substrate is n-type, and the amorphous silicon film is p-doped.

Optionally, at step 140, a dielectric capping layer with desired anti-reflection and diffusion barrier properties is deposited over the doped amorphous silicon layer. In one embodiment, the dielectric capping layer is deposited a film thickness of about 900 Å. In one embodiment, a layer of silicon nitride (SiN) is deposited by the same or a different vacuum deposition chamber. In one embodiment, a silicon nitride layer is deposited from a mixture of silicon-containing gas and one or more nitrogen containing gases. Silicon-containing gases may include silane, disilane, tetrafluorosilane, or the like. The one or more nitrogen-containing gases may include ammonia ($NH_3$), nitrous oxide ($N_2O$), nitric oxide (NO), nitrogen gas ($N_2$), combinations thereof, or derivatives thereof. The one or more nitrogen-containing gas can be delivered at a flow rate of about 5 sccm or higher. Hydrogen-containing gases, such as hydrogen gas, may also be included for depositing the dielectric capping layer to improve film surface properties.

At step 150, heat is applied to a second surface of the crystalline silicon substrate, which is on the opposite side of the substrate from the side on which the doped amorphous silicon layer was deposited. The heat may be applied in any manner such that the application of heat is controlled and limited to being supplied to the second surface of the substrate. In one embodiment, heat is applied to the second surface of the substrate in a rapid thermal processing (RTP) chamber. In one example, heat is applied to the second surface of the crystalline silicon substrate at a suitable temperature, such as between about 750° C. and about 1200° C., and over a suitable period of time, such as between about 5 seconds and about 30 seconds, across the silicon substrate to form the desired depth of the p-n junction and the desired dopant profile. In one embodiment, rapid thermal processing (RTP) chamber is a Vantage Radiance Plus™ RTP chamber, which is available from Applied Materials Inc. of Santa Clara, Calif. However, it is contemplated that other processing chambers such as a rapid thermal annealing (RTA) chamber, an annealing chamber, a tube furnace or belt furnace chamber may also be used to practice the present invention.

In one embodiment, a temperature of about 1000° C. is applied to the second side of the substrate for a period of approximately 30 seconds. In one embodiment, a temperature of about 1000° C. is applied to the second side of the substrate for a period of approximately 120 seconds. In one embodiment, a temperature of about 950° C. is applied to the second side of the substrate for a period of approximately 120 seconds.

In one embodiment, the heating step is performed such that a temperature gradient is created between the second surface and the first surface of the crystalline silicon substrate, so that a temperature of an interface between the doped amorphous silicon film and the crystalline silicon substrate is higher than a temperature of a point in the doped amorphous silicon film that is distance from the interface between the doped amorphous silicon film and the crystalline silicon substrate. In one embodiment, the application of the temperature gradient for the short time period is sufficient to cause the amorphous silicon to crystallize starting at the interface with the crystalline silicon substrate and continuing outwards to the outer surface of the doped amorphous silicon layer. Thus, directional solid phase crystallization takes place. As this crystallization occurs, the doped amorphous silicon assumes the same grain structure as that of the underlying crystalline silicon substrate.

Additionally, in one embodiment, the application of the temperature gradient for a controlled time period causes the dopant to diffuse into the original crystalline substrate, resulting in a desired dopant profile with a higher concentration of dopant remaining at the junction with the dielectric surface and a lower concentration of dopant at the p-n junction, which is advantageous since having lower doping profile near the p-n junction is important for optimizing the minority carrier lifetime in the vicinity of the p-n junction.

In one embodiment, the amorphous silicon is phosphorous-doped (n-type) and the crystalline silicon substrate is p-type. In this embodiment, a p-n junction is formed as a result of epitaxial conversion of the deposited amorphous silicon material. In one embodiment, the depth of the p-n junction is controlled by altering the level of doping in the deposited amorphous silicon layer since the doping atoms diffuse into the p-type substrate during the directional solid phase crystallization. In one embodiment, the depth of the p-n junction is controlled by controlling the thickness of doped amorphous silicon layer, the annealing temperature, and/or the annealing time.

Figure 2:
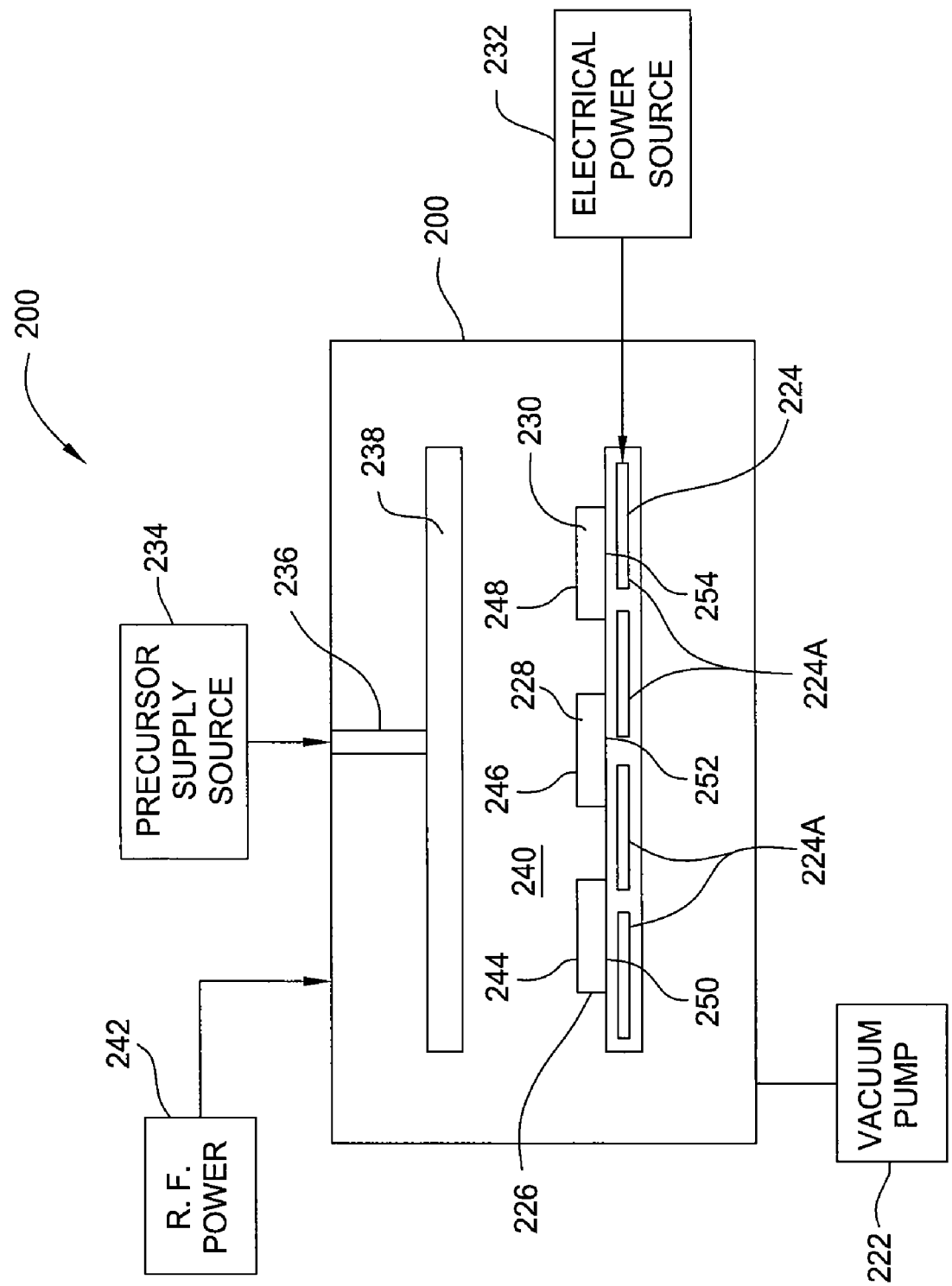
FIG. 2 is a schematic, cross-sectional representation of a plasma-enhanced chemical vapor deposition (PECVD) chamber, which may be used in carrying out deposition processes according to certain embodiments of the present invention.

FIG. 2 is a schematic, cross-sectional representation of a plasma-enhanced chemical vapor deposition (PECVD) chamber 200, which may be used in carrying out deposition processes according to certain embodiments of the present invention. In one embodiment, the chamber 200 includes a plurality of walls enclosing a processing area 240. The processing area 240 may be evacuated by a vacuum pump 222 as known in the art. A support 224 upon which a plurality of crystalline silicon substrates 226, 228, and 230 may be placed is disposed in the processing area. As shown in FIG. 2, the substrates 226, 228, and 230 are positioned horizontally on the support 224. Thus, only the first surfaces 244, 246, 248 are exposed to the process area 240. The support 224 is provided with one or more heating element 224A that are embedded therein and connected to an electrical power source 232 to heat the substrates 226, 228, 230 to a temperature required for PECVD within the chamber 200. In one embodiment, the heating element 224A is a resistive heating element, or a tungsten halogen lamp, which provides sufficient energy to thermally process the substrate, for example, heating the substrates 226, 228, 230 deposited on the support 224 to a desired temperature. As will be discussed below, in one embodiment, the heating is accomplished by applying heat at a suitable temperature for a suitable period of time to form a temperature gradient across the silicon substrates 226, 228, 230 from one side where the heating element is located to the other side on which the amorphous silicon film is deposited. A precursor supply source 234 is connected to a conduit 236 for conveying the appropriate compounds to a showerhead 238. The showerhead 238 distributes the precursor compounds throughout the processing area 240 of the chamber 200. The precursor compounds may be energized into plasma within the processing area 240 by the application of RF power to the showerhead 238 from a power source 242. Typically, the support 224 is electrically grounded. The plasma produces ions within the process area 240 then cause an amorphous silicon film to be deposited upon the first surfaces 244, 246, 248 the substrates 226, 228, 230. For a more detailed illustration and explanation of one embodiment of a PECVD useful for carrying out embodiments of the present invention, reference is made to U.S. Pub. No. 2006/0060138 A1, which is incorporated in its entirety herein. It is also contemplated that other processing chambers, such as a high-density plasma CVD tool, hot wire chemical vapor deposition (HWCVD) chambers or atomic layer deposition (ALD) chambers, may also be used to practice the present invention. In one embodiment, the chamber 200 is an AKT™ series PECVD chamber available from Applied Materials, Inc., located in Santa Clara, Calif.

In one embodiment, plasma deposition within the chamber 200 continues for a period of time sufficient to deposit a layer of doped amorphous silicon on the substrate surfaces 244, 246, 248. In one embodiment, the layer of doped amorphous silicon is deposited at a film thickness from about 100 Å to about 1000 Å. In one embodiment, the layer of amorphous silicon is heavily doped with phosphorous. In one embodiment, the layer of amorphous silicon is doped with phosphorous to a concentration of about $1.5 \times 10^{21}$ atoms/cm$^3$.

In one embodiment, after the doped amorphous silicon is deposited, a dielectric layer is deposited thereover in the same chamber 200 or in a different but similarly configured chamber. In one embodiment, the dielectric layer is a silicon nitride layer deposited at a film thickness of about 900 Å. In one embodiment, a single layer of silicon nitride is deposited onto the doped amorphous silicon layer. In one embodiment, multiple layers of silicon nitride are deposited onto the doped amorphous silicon layer. In the embodiment where the dielectric layer is multiple layers of silicon nitride structure, the dielectric layer can be deposited with the high dopant concentration containing layer being adjacent or next to the doped amorphous silicon layer, while the majority of the SiN film has a dopant concentration that offers the best anti-reflection properties. In one embodiment, the dielectric layer deposited on the amorphous silicon layer has dopant concentration that is greater than one or more of the dielectric layers deposited thereon. In another embodiment, the dielectric layer deposited on the amorphous silicon layer has dopant concentration that is greater than all of the dielectric layers deposited thereon. In one embodiment, the dielectric layer is a dielectric capping layer 270, which is discussed below.

Figure 3:
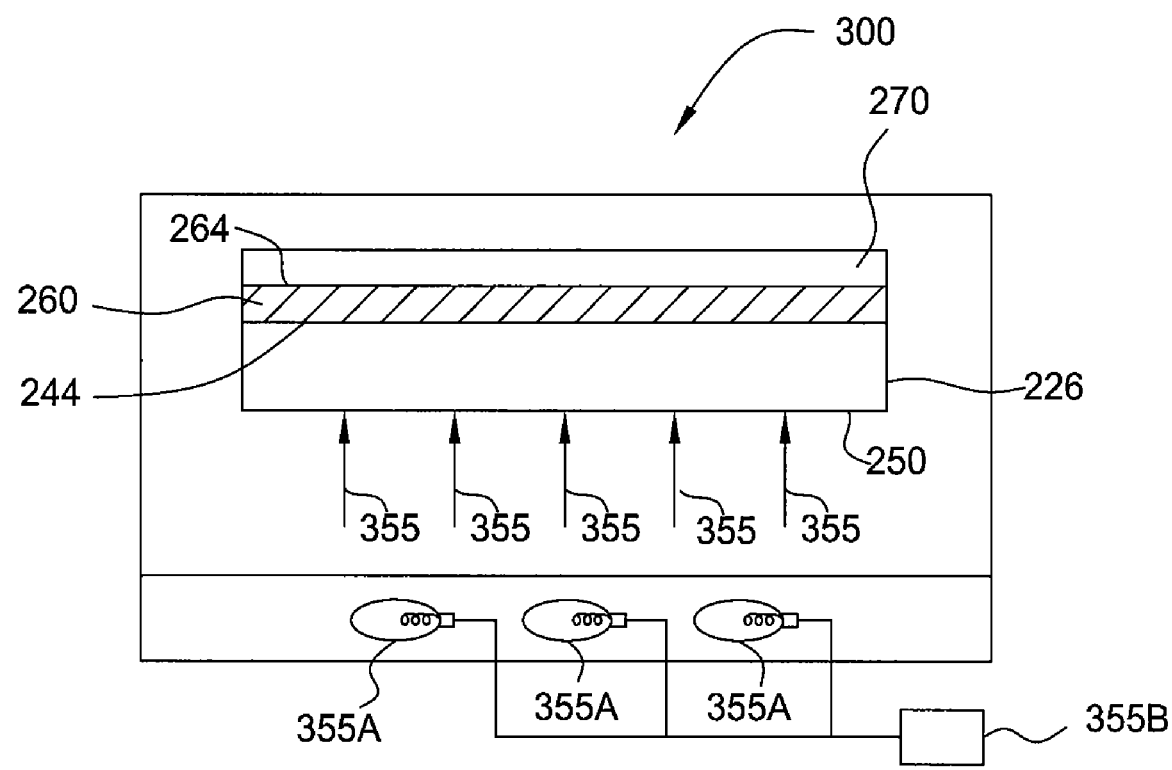
FIG. 3 is a schematic, cross-sectional view of a chamber for heating the second surfaces of the silicon substrates illustrated in FIG. 2.

FIG. 3 is a schematic, cross-sectional view of a chamber 300 for heating the second surfaces 250, 252, 254 of the silicon substrates 226, 228, 230 illustrated in FIG. 2. In one embodiment, the chamber 300 is a rapid thermal processing (RTP) chamber within which the application of the heat is controlled. In FIG. 3 only a single substrate 226 is shown for clarity. In one embodiment, the crystalline substrate 226 has a doped amorphous silicon layer 260 deposited thereover. In one embodiment, the doped amorphous silicon layer 260 has a dielectric capping layer 270 deposited thereover.

In one embodiment, the dielectric capping layer 270 is a silicon oxide layer (SiO$_x$), silicon nitride (SiN) or silicon oxynitride (SiON) layer that is primarily formed on the doped amorphous silicon layer 260 of a silicon containing substrate. In another embodiment, the dielectric capping layer 270 is a silicon oxide layer formed on the amorphous silicon layer 260. In one example, the dielectric capping layer 270 formation process is performed at a temperature greater than about 800° C., and creates a thermal gradient in the amorphous silicon layer 260. The silicon oxide containing dielectric capping layer 270 may be formed using a conventional thermal oxidation process, such a furnace annealing process, a rapid thermal oxidation process, an atmospheric pressure or low pressure CVD process, a plasma enhanced CVD process, a PVD process, hot wire CVD or applied using a sprayed-on, spin-on, roll-on, screen printed, or other similar type of deposition process. In one embodiment, the dielectric capping layer 270 formation process comprises providing a nitrogen (N$_2$) rich and/or an oxygen (O$_2$) containing gas from a gas source into the processing region of a processing chamber to oxidize and consume at least a portion of the amorphous silicon layer 260. In one embodiment, the gas source is contained within the precursor supply source 234, which is described above. In one embodiment, the process of depositing an amorphous silicon layer 260 on a crystalline substrate, the formation of the dielectric capping layer 270 over the amorphous silicon layer 260 and process of crystallizing the amorphous silicon layer are all performed in a single processing chamber (e.g., chamber 300). In one embodiment, the dielectric capping layer 270 formation process is performed in a separate processing chamber that is similarly configured as the chamber 300 shown in FIG. 3. In one configuration, a first processing chamber, which is configured to form an amorphous silicon layer on a substrate, is transferrably coupled to a second processing chamber, which is adapted to form the dielectric capping layer over the formed amorphous silicon layer, by use of a robotic device (e.g., SCARA robot). In one embodiment, the first and second processing chambers are each connected to a central transfer chamber (not shown) that has a robotic device (not shown) and pump (not shown) that are used in combination to transfer one or more substrates between the first and second processing chambers in an inert gas containing and/or vacuum pressure environment. In another embodiment, a processing system (not shown) comprises a first processing chamber that is configured to deposit amorphous silicon layer 260 on a crystalline substrate, a second processing chamber that is configured to form the dielectric capping layer 270 over the amorphous silicon layer 260 and a third processing chambers that is configured to perform a crystallization process (e.g., step 150), where each of the processing chambers are connected to a central transfer chamber (not shown) that has a robotic device (not shown) and pump (not shown) that are used in combination to transfer one or more substrates between the first, second and third processing chambers in an inert gas containing and/or vacuum pressure environment. An example of a central transfer chamber and processing system that may be adapted to perform one or more of the processes and/or accept one or more of the processing chambers described herein is further disclosed in the commonly assigned issued U.S. Pat. Nos. 5,186,718 and 6,440,261, which are both incorporated by reference herein in their entirety.

In one embodiment, one or more heating elements 355A are located under the second surfaces of the silicon substrates 226, 228, 230, providing heat 355 to the second surface of the silicon substrates 226, 228, 230 that is opposite to the first surface, such as second substrate surfaces 250, 252, 254 illustrated in FIG. 2. In one embodiment, the heating elements 355A are connected to a lamp controller 355B that is used to control desired heating parameters during the process. In one embodiment, the heating element 355A is a IR heating lamp, or a tungsten halogen lamp which provides sufficient energy to thermally process the substrate. In one example, the heating element 355A is configured to heat the second surface of the crystalline silicon substrates 226, 228, 230, which is on the opposite side of the substrate from the side on which the doped amorphous silicon layer is deposited, thereby creating a temperature gradient across the silicon substrates 226, 228, 230, that is, from the second surface where the heating element is located to the first surface of the substrate on which the amorphous silicon film is deposited. In one embodiment, the heat 355 is applied to the second surface 250 of the silicon substrate 226 at a temperature of about 750° C. to about 1200° C. for a time period of about 5 seconds to about 30 seconds. In one embodiment of the present invention, the heat 355 is applied to the second substrate surface 250 at a temperature of about 1000° C. for a period of about 30 seconds. In one embodiment, the heat 355 is applied to the second substrate surface 250 at a temperature of about 950° C. for a time period of about 120 seconds. In one embodiment, the heat 355 is applied to the second substrate surface 250 at a temperature of about 1000° C. for a time period of about 120 seconds.

It should be noted that the first surface of the substrate described herein is referring to the surface of the substrate that has the amorphous silicon film deposited thereon, such as first surfaces 244, 246, 248 shown in FIG. 2. In one embodiment, the second surface of the substrate is a surface of the substrate that is generally parallel and opposite to the first surface of the substrate. In addition, the heating element 355A (FIG. 3) or 224A (FIG. 2) is generally used to create a temperature gradient between the first surface and the second surface of the substrate, such that a temperature of an interface between the doped amorphous silicon film and the crystalline silicon substrate is higher than a temperature of a point in the doped amorphous silicon film that is distance from the interface between the amorphous silicon film and the crystalline silicon substrate.

In one embodiment, the application of heat 355 to the second surface 250 of the substrate 226 creates a temperature gradient between the second surface 250 of the substrate 226 and a first surface 264 of the doped amorphous silicon layer deposited thereover. In one embodiment, the temperature gradient is between about 2° C. and 10° C. In one example, the temperature gradient is about 5° C.

In one embodiment, the application of heat 355 at a high temperature for a short time period of causes the amorphous silicon layer 260 to crystallize commencing at the first surface 244 of the substrate 226 and progressing upwardly to the first surface 264 of the amorphous silicon layer 260. As this directional crystallization occurs, the atoms of silicon which were amorphous assume the grain structure of the crystalline silicon substrate 226.

In one embodiment, the application of heat 355 at a high temperature for a short time period causes the dopant concentration to remain high at the first surface 264 of the amorphous silicon layer 260 and diffuse into the original crystalline substrate 226, establishing a p-n junction at a desired depth in the substrate 226.

Figure 4:
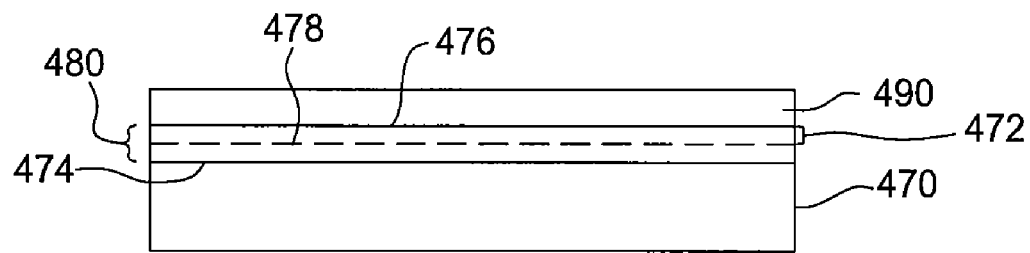
FIG. 4 is a schematic, cross-sectional view of a crystalline silicon substrate with a solid phase epitaxial film generated from a doped amorphous silicon structure thereon with a dielectric capping layer deposited thereover fabricated according to one embodiment of the present invention.

FIG. 4 is a schematic, cross-sectional view of a crystalline silicon substrate 470 with a solid phase epitaxial film generated from a doped amorphous silicon film 472 thereon with a dielectric capping layer 490 deposited thereover fabricated according to one embodiment of the present invention. As previously described, the resulting crystalline structure has a consistent grain structure throughout. For instance, if an original silicon substrate 470 is a single crystal substrate, then the epitaxially-grown, converted amorphous silicon film 472 is a single crystal material having the same grain structure as that of the original substrate 470.

During the directional solid phase crystallization of phosphorous-doped amorphous silicon, phosphorous atoms diffuse into the p-type substrate 470. Thus, if the amorphous silicon film, as deposited, extends from a first surface 476 of the amorphous silicon film to a first surface 478 of the silicon substrate 470, then upon conversion of the amorphous silicon material, the phosphorous atoms diffuse into the substrate 470 to a depth 474 to form a p-n junction. Thereby a region 480, which is a heavily doped n-type region, is provided on the p-type single crystal substrate 470.

EXAMPLE 1

In one example, a 100 Å thick amorphous silicon film was deposited via plasma enhanced chemical vapor deposition onto a crystalline silicon substrate with a phosphorous doping concentration of $1.5 \times 10^{21}$ atoms/cm$^3$. A 900 Å thick silicon nitride film was then deposited over the phosphorous doped amorphous silicon film in the same chamber. The resulting structure was annealed via RTP at 950° C. for 120 seconds in a nitrogen environment. The phosphorous concentration in contact with the silicon nitride layer remained heavily doped. The phosphorous in contact with the crystalline substrate diffused into the substrate resulting in a p-n junction depth of 900 Å. The resulting structure had a dopant profile with a high concentration of dopant collected at the interface between the silicon nitride layer and the silicon layer decreasing to a lower concentration of dopant at the p-n junction.

EXAMPLE 2

In another example, a 100 Å thick amorphous silicon film was deposited via plasma enhanced chemical vapor deposition onto a crystalline silicon substrate with a phosphorous doping concentration of $1.5 \times 10^{21}$ atoms/cm$^3$. A 900 Å thick silicon nitride film was then deposited over the phosphorous doped amorphous silicon film in the same chamber. The resulting structure was annealed via RTP at 1000° C. for 120 seconds in a nitrogen environment. The phosphorous concentration in contact with the silicon nitride layer remained heavily doped. The phosphorous in contact with the crystalline substrate diffused into the substrate resulting in a p-n junction depth of 1350 Å. The resulting structure had a dopant profile with a high concentration of dopant collected at the interface between the silicon nitride layer an silicon d the layer decreasing to a lower concentration of dopant at the p-n junction.

Although the invention has been described in accordance with certain embodiments and examples, the invention is not meant to be limited thereto. For instance, the PECVD process described herein can be carried out using other chemical vapor deposition (CVD) chambers, adjusting the gas flows, pressure, plasma density, and the temperature so as to obtain high quality amorphous films at practical deposition rates. Additionally, embodiments of the present invention may be carried out via hot wire chemical vapor deposition (HWCVD), low pressure chemical vapor deposition (LPCVD), or physical vapor deposition (PVD). Furthermore, embodiments of the invention include scaling up or scaling down any of the process parameters or variables as described herein according to the number of substrates being utilized, chamber conditions, chamber sizes, and the like.

Additionally, the directional heating technique described herein is not limited to rapid thermal processing. Other methods of subjecting a substrate to a temperature gradient may be used as well.

While the foregoing is directed to embodiments of the present invention, other and further embodiments of the invention may be devised without departing from the basic scope thereof, and the scope thereof is determined by the claims that follow.

The invention claimed is:

1. A method of heat treating a crystalline silicon substrate, comprising:
    depositing an amorphous silicon film on a first surface of the crystalline silicon substrate, wherein the first surface of the crystalline silicon substrate is opposite to a second surface of the crystalline silicon substrate, a first surface of the amorphous silicon film is opposite to a second surface of the amorphous silicon film, and an interface is formed between the first surface of the crystalline silicon substrate and the second surface of the amorphous silicon film; and heating the crystalline silicon substrate and the amorphous silicon film to a temperature that is sufficient to crystallize the amorphous silicon film by solid phase crystallization, wherein the heating creates a temperature gradient in which the temperature at the second surface of the crystalline silicon substrate is greater than the temperature at the first surface of the amorphous silicon film, and the temperature gradient is between about 2° C. and about 10° C.

2. The method of claim 1, wherein the heating comprises delivering heat to the second surface of the crystalline silicon substrate from a heating element disposed adjacent to the second surface of the crystalline silicon substrate, and the temperature at the first surface of the amorphous silicon film is less than the melting point of the amorphous silicon film.

3. The method of claim 2, wherein the second surface of the crystalline silicon substrate is heated to a temperature between about 750° C. and about 1200° C. for a time period between about 5seconds and about 30 seconds.

4. The method of claim 1, wherein depositing the amorphous silicon film further comprises delivering a mixture of precursors comprising a silicon-containing compound into a vacuum deposition chamber in which the crystalline silicon substrate is disposed.

5. The method of claim 4, wherein the mixture of precursors comprises a dopant precursor of opposite conductivity type than the crystalline silicon substrate.

6. The method of claim 1, further comprising forming a dielectric layer on the amorphous silicon film prior to the heating of the crystalline silicon substrate and the amorphous silicon film.

7. The method of claim 6, wherein the dielectric layer comprises two or more dielectric layers which each have different doping concentrations, and wherein the dielectric layer of the two or more dielectric layers that is disposed on the amorphous silicon film has a greater doping level than at least one of the other two or more dielectric layers.

8. The method of claim 1, wherein the temperature gradient is about 5° C.

9. The method of claim 1, wherein the temperature gradient is maintained for a time period between about 5 seconds and about 30 seconds.

10. A method of heat treating a crystalline silicon substrate to form a p-n junction, comprising:
depositing an amorphous silicon film on a first surface of the crystalline silicon substrate, wherein the first surface of the crystalline silicon substrate is opposite to a second surface of the crystalline silicon substrate, a first surface of the amorphous silicon film is opposite to a second surface of the amorphous silicon film, and an interface is formed between the first surface of the crystalline silicon substrate and the second surface of the amorphous silicon film;
depositing a dielectric layer over the amorphous silicon film; and
heating the crystalline silicon substrate and the amorphous silicon film to a temperature that is sufficient to crystallize the amorphous silicon film by solid phase crystallization, wherein the heating creates a temperature gradient between the second surface of the crystalline silicon substrate and the first surface of the amorphous silicon film in which the temperature at the first surface of the crystalline silicon substrate is greater than the temperature at the first surface of the amorphous silicon film, and the temperature gradient is between about 2° C. and about 10° C.

11. The method of claim 10, wherein depositing the amorphous silicon film further comprises delivering a mixture of precursors comprising a silicon-containing compound and a phosphorous-containing compound into a vacuum deposition chamber.

12. The method of claim 10, wherein the second surface of the crystalline silicon substrate is heated to a temperature between about 750° C. and about 1200° C. for a time period between about 5seconds and about 30 seconds.

13. The method of claim 10, wherein the dielectric layer is deposited in the same vacuum deposition chamber as the amorphous silicon film, and the dielectric layer is deposited prior to the heating of the crystalline silicon substrate and the amorphous silicon film.

14. The method of claim 10, wherein the temperature gradient is about 5° C.

15. The method of claim 10, wherein the dielectric layer comprises two or more dielectric layers that each have different doping concentrations, and wherein the dielectric layer of the two or more dielectric layers that is disposed on the amorphous silicon film has a greater doping level that at least one of the other two or more dielectric layers.

16. The method of claim 10, wherein the heating of the crystalline silicon substrate and the amorphous silicon film is maintained for a sufficient time to cause a greater concentration of doping atom to remain at an interface between the dielectric layer and the amorphous silicon film than the concentration of doping atom at the first surface of the amorphous silicon film.

17. The method of claim 10, wherein the temperature of the first surface of the amorphous silicon film is less than the melting point of the amorphous silicon film.

18. The method of claim 17, wherein the temperature gradient is maintained for a time period between about 5 seconds and about 30 seconds.

19. A method of heat treating a crystalline silicon substrate, comprising:
depositing an amorphous silicon film on an upper surface of the crystalline silicon substrate during a plasma enhanced chemical vapor deposition process within a deposition chamber, wherein the upper surface of the crystalline silicon substrate is opposite to a lower surface of the crystalline silicon substrate, an upper surface of the amorphous silicon film is opposite to a lower surface of the amorphous silicon film, and an interface is formed between the upper surface of the crystalline silicon substrate and the lower surface of the amorphous silicon film; and
heating the crystalline silicon substrate and the amorphous silicon film to a temperature that is sufficient to crystallize the amorphous silicon film by solid phase crystallization within the deposition chamber, wherein the heating creates a temperature gradient in which the temperature at the lower surface of the crystalline silicon substrate is greater than the temperature at the upper surface of the amorphous silicon film.

20. The method of claim 19, wherein the temperature gradient is between about 2° C. and about 10° C.

* * * * *

UNITED STATES PATENT AND TRADEMARK OFFICE
CERTIFICATE OF CORRECTION

PATENT NO. : 7,981,778 B2
APPLICATION NO. : 12/507761
DATED : July 19, 2011
INVENTOR(S) : Rana et al.

It is certified that error appears in the above-identified patent and that said Letters Patent is hereby corrected as shown below:

In the Detailed Description:

Column 10, Line 29, please delete "an" and insert --and the-- therefor;

Column 10, Line 29, please delete "d the";

In the Claims:

Column 11, Claim 3, Line 19, please delete "5seconds" and insert --5 seconds-- therefor;

Column 12, Claim 12, Line 12, please delete "5seconds" and insert --5 seconds-- therefor;

Column 12, Claim 14, Line 19, please delete "about5°" and insert --about 5°-- therefor.

Signed and Sealed this
Twenty-fifth Day of October, 2011

David J. Kappos
*Director of the United States Patent and Trademark Office*